United States Patent

[11] 3,562,608

[72] Inventors Robert C. Gallagher
Normandy;
James R. Cricchi, Catonsville, Md.

[21] Appl. No. 809,668
[22] Filed Mar. 24, 1969
[45] Patented Feb. 9, 1971
[73] Assignee Westinghouse Electric Corporation
Pittsburgh, Pa.
a corporation of Pennsylvania

[54] VARIABLE INTEGRATED COUPLER
8 Claims, 4 Drawing Figs.

[52] U.S. Cl. .......... 317/235, 317/234, 307/304
[51] Int. Cl. .......... H01l 11/14
[50] Field of Search .......... 317/234, 235, 237—241

[56] References Cited
UNITED STATES PATENTS

| | | | |
|---|---|---|---|
| 2,648,805 | 8/1953 | Spenke et al. ................ | 317/235 |
| 2,981,877 | 4/1961 | Nayce ................ | 317/235 |
| 3,158,754 | 11/1964 | Yu ................ | 317/235X |
| 3,401,319 | 9/1968 | Watkins ................ | 317/235 |
| 3,498,833 | 3/1970 | Lehrer ................ | 317/235X |

*Primary Examiner*—James D. Kallam
*Attorneys*—F. Shapoe and C. Menzemer

ABSTRACT: Described is an integrated circuit variable coupler utilizing metal oxide semiconductor (MOS) techniques, wherein the degree of coupling or capacitance of the coupler is a function of the size of the depletion region of a PN junction which can be varied by a voltage applied across a thin film resistor deposited on an oxide layer.

INVENTORS.
ROBERT C. GALLAGHER
JAMES R. CRICCHI
BY.
Ernest P. Klipfel
ATTORNEY

VARIABLE INTEGRATED COUPLER

BACKGROUND OF THE INVENTION

In the past, couplers for integrated circuits have usually comprised a pair of spaced conductive strips deposited on a silicon dioxide layer formed on a silicon substrate, the oxide acting as a dielectric between the two strips which form the plates of the coupler. The difficulty with such couplers, however, is that the degree of coupling can be changed only by physically varying the spacing between the conductors and this, of course, is not feasible in integrated circuit applications.

SUMMARY OF THE INVENTION

As an overall object, the present invention provides a variable coupler for use in integrated circuit applications wherein the degree of coupling can be varied as a function of an applied external direct current bias.

More specifically, an object of the invention is to provide a coupler of the type described incorporating a PN junction and wherein the degree of coupling is varied by varying the depletion-layer capacitance of the PN junction.

In accordance with one embodiment of the invention, a variable coupler is provided comprising a substrate of semiconductive material, preferably silicon, having a layer of silicon dioxide or some other suitable insulator such as silicon nitride covering the surface thereof. Etched into the oxide layer is a pair of openings; and beneath one of these openings is a diffused region forming a PN junction with the silicon substrate. Beneath the other opening is a portion of heavily doped region of the same type conductivity as the substrate, this region preferably being in the form of a ring extending around the first-mentioned opening and the PN junction. Between the openings, on the surface of the silicon dioxide layer, is a thin film resistor.

A reverse bias is applied across the PN junction via contacts in the openings formed in the oxide layer; and a potential is applied across the thin film resistor, one end of which is grounded and at essentially the same potential as the substrate. As the applied voltage across the resistor is increased, the voltage at the end of the resistor adjacent the PN junction will reach a threshold value relative to the substrate, at which time induced inversion and depletion regions form adjacent the depletion later of the PN junction and begin to extend across the surface of the substrate beneath the thin film resistor and toward the opposite terminal. In this manner, the depletion-layer capacitance is varied, as is the degree of coupling between the aforesaid two terminals. Assuming that the thin film resistor is rectangular and of constant width along its length, the degree of coupling will vary linearly as the bias voltage is applied. However, if the thin film resistor is not rectangular in shape, then the threshold voltage will not move across the resistor linearly, but can be made to vary in any desirable analytical manner such as exponential, square law or the like. Thus, the capacitance obtainable can be any analytical function of applied bias voltage.

The above and other objects and features of the invention will become apparent from the following and detailed description taken in connection with the accompanying drawings which form a part of this specification, and in which.

Figure 3:
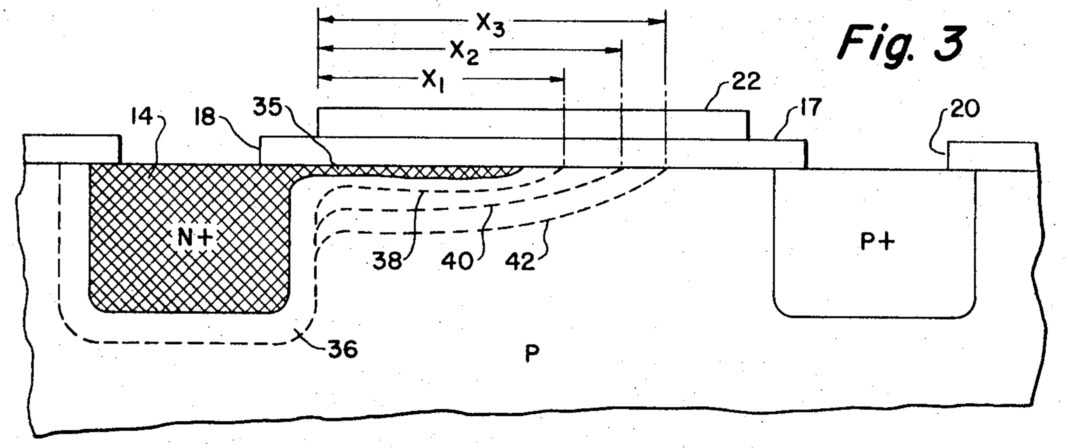

FIG. 3 graphically illustrates the operation of the present invention; and

Figure 4:
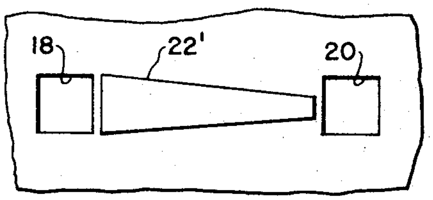

FIG. 4 illustrates a type of thin film resistor usable with the present invention whereby a nonlinear variation in degree of coupling can be obtained.

Figure 1:
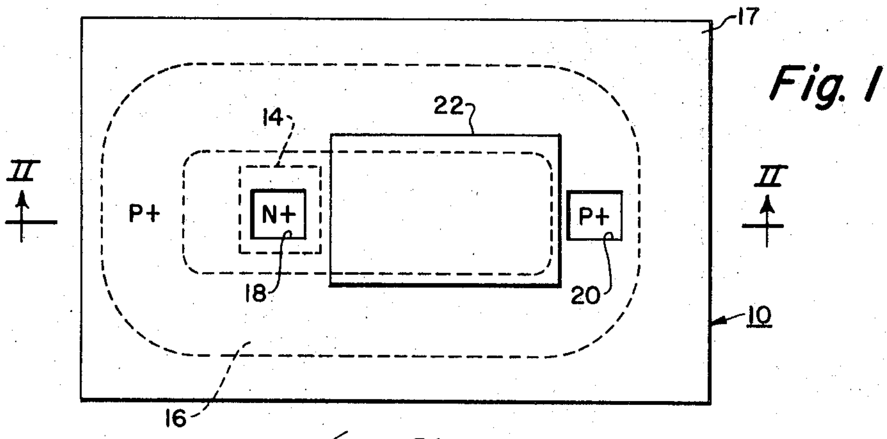
FIG. 1 is a top view of one embodiment of the present invention.
Figure 2:
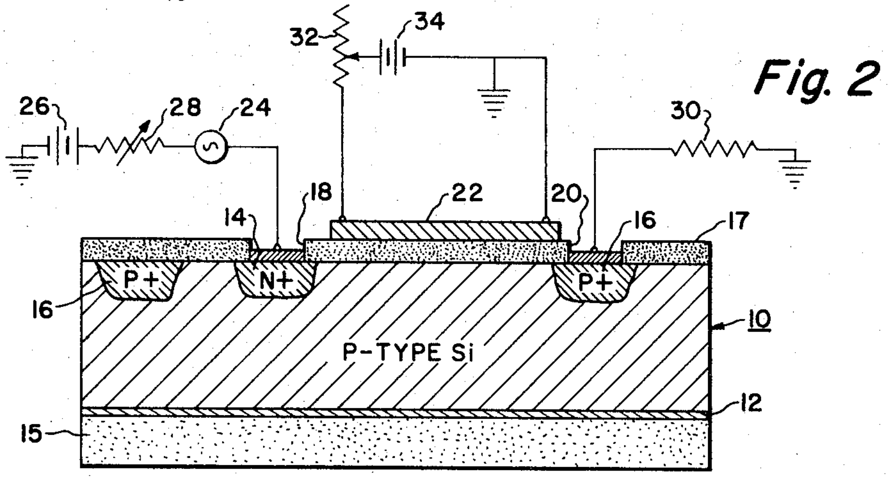
FIG. 2 is a cross-sectional view taken substantially along line II–II of FIG. 1.

With reference now to the drawings, and particularly to FIGS. 1 and 2, the variable coupler shown includes a wafer 10 of P-type silicon having its lower surface metallized to form layer of metal 12. This metallized lower surface is isolated from any other electrical contact by an insulating substrate 15, such as $Al_2O_3$. Diffused into the upper surface of the wafer 10 is an N-type region 14. Also diffused into the upper surface of the wafer 10 is a heavily doped P-type region 16 which, as shown in FIG. 1, is in the form of a ring surrounding the N-type region 14. The upper surface of the wafer 10 is covered with a layer of silicon dioxide having openings 18 and 20 etched therein above the N-type region 14 and above a point in the P-type region 16. Extending between the openings 18 and 20 above the silicon dioxide layer 17 is a thin film resistor 22 which overlaps the N-type region 14 and the P-type region 16. Metal contacts are attached to the N-type region 14 and P-type region 16 in the openings 18 and 20 as shown. The contact above the N-type region 14 is connected through a signal source 24, a source of biasing potential 26 and a variable resistor 28 to ground. The P-type region 16 is connected to ground through resistor 30. The reverse bias across the PN junction can be varied by variable resistor 28, but in any event is less than the junction reverse breakdown voltage.

The right end of the thin film resistor 22, as shown in FIG. 1, is grounded; while the left end of the thin film resistor 22, adjacent the N-type region 14, is connected through a potentiometer 32 to a source of potential, such as battery 34. With the arrangement shown, the PN junction formed between region 14 and the substrate 10 is biased in the reverse direction and surrounded by a depletion region identified by reference numeral 36 in FIG. 3. When a positive potential on the resistor 22 rises above a certain threshold value with respect to the N-type region 14, an induced inversion region 35 and associated depletion region begin to form adjacent to the surface of the substrate under the silicon dioxide layer 17 and adjacent to the diffused N-type region 14. Let us assume, for example, that this threshold voltage is 2.5 volts above the bias voltage, $V_{14}$, on region 14. The left end of the resistor 22 will always be grounded or at least near the potential of the substrate 10. If the potentiometer 32 is adjusted such that the positive potential at the left end of the resistor 22 is below the threshold value of 2.5 volts, no inversion region (identified by reference numeral 35 in FIG. 3) will be induced beneath the silicon dioxide layer 17. However, as the current through the resistor 22 is increased by adjustment of the potentiometer 32, a point is reached where the left end of the resistor 22 will be exactly at the threshold voltage of ($V_{14} + 2.5$) volts, thereby causing generation of a slight induced inversion region adjacent to the diffused N-type region 14. Under the circumstances described, and with the voltage at the left end of resistor 22 exactly at ($V_{14} + 2.5$) volts, the voltage will drop along the resistor 22 from left to right until it approaches zero at the extreme right end.

Now, let us assume that the current through the resistor 22 is increased further such a that the voltage at the left end is 5 volts above the bias on region 14. Assuming that a uniform voltage drop occurs along the length of the resistor 22, the voltage at the center of the resistor will now be ($V_{14} + 2.5$) volts, and an induced inversion layer and associated depletion region now exist beneath the surface of the oxide layer 17 for approximately one-half the length of the resistor 22. The lower edge of this depletion region is identified by the reference numeral 38 in FIG. 3 and extends for the distance $X_1$. These inversion and depletion regions are formed by virtue of the fact that the bias voltage on the resistor 22 is, in effect, forcing holes out of the now-formed induced depletion region 38 and attracting free electrons to the inversion layer, thereby adding to the original junction area and the associated depletion region 36.

As the current through the resistor 22 is increased further, the depletion region is now defined by the broken line 40 and extends along the length $X_2$. The inversion region, identified by reference numeral 35 in FIG. 3, will also increase in length under these circumstances over that shown in the drawing. As the current is further increased, the lower end of the induced depletion region, identified by the reference numeral 42, extends for the distance $X_3$. In this manner, it can be seen that as the voltage drop across resistor 22 is increased, the length of the induced inversion region and associated depletion region also increase and the capacitance or coupling effect increases. Conversely, by reducing the bias across the resistor 22, the induced inversion and depletion regions are shortened and the capacitance or coupling effect decreased. Stated in other words, the exact point at which the threshold voltage necessary to form an induced depletion region exists may be moved up or down the resistor 22 by varying the bias across the resistor, thereby lengthening or shortening the induced inversion and depletion regions and correspondingly varying the coupling effect.

The above discussion assumed, of course, that the voltage drop across resistor 22 was linear, meaning that the resistor is rectangular in shape. However, by varying the shape of the resistor, the exact point at which the threshold voltage exists along the length of the resistor as the bias potential is increased can be made to vary exponentially. This is shown, for example, in FIG. 4 where the thin film resistor 22' is narrower at its right end than its left end. Consequently, the incremental resistance along the length of the resistor 22' from left to right will increase. Consequently, as the total voltage drop across the resistor is increased, the variation in coupling effect or capacitance can be made to vary exponentially. As will be appreciated, other and different shapes of thin film resistors can be utilized to obtain a specified analytical function.

It will be appreciated that instead of a P-type substrate, and N-type substrate could be used with equal effectiveness, in which case region 14 would be P-type and region 16 heavily doped N-type. In this case, it would be necessary to reverse the polarity of the bias across the resistor 22. Aside from this, the operation of the device would be the same as that described above.

The coupler shown in the drawings is an enhancement mode device, meaning that the inversion region 35 does not exist for zero voltage applied to the resistor at 32. However, if the semiconductor resistivity is raised, a depletion mode device results in which case an N-type channel will exist between regions 14 and 16 in FIG. 1 with zero voltage applied across resistor 22. In this case, the polarity of the voltage across resistor must be grounded. With a depletion mode device of this type, the threshold voltage point moves from right to left, thereby decreasing the length and area of the inversion region and its associated depletion region rather than increasing them as is the case with the device shown in the drawings.

Although the invention has been shown in connection with certain specific embodiments, it will be readily apparent to those skilled in the art that various changes in form and arrangement of parts may be made to suit requirements without departing from the spirit and scope of the invention.

We claim:

1. A variable coupler comprising a substrate of semiconductive material, a layer of oxide material covering one surface of said substrate, a pair of spaced openings in said oxide layer, a region of one type conductivity diffused into said substrate beneath one of said openings to form a PN junction with the substrate, a region of the other type conductivity diffused into said substrate beneath said other opening, thin film resistive means deposited on said oxide layer and extending between said openings, means for establishing a biasing potential between opposite ends of said resistive means, and means for varying the bias potential to thereby vary the degree of capacitive coupling between said regions of opposite conductivity type.

2. The variable coupler of claim 1 including means for reverse biasing said PN junction.

3. The variable coupler of claim 1 wherein the biasing potential between opposite ends of said resistive means creates an induced depletion region in the substrate beneath said resistive means, the induced depletion region communication with the normal depletion region of the PN junction, the means for varying said biasing potential acting to vary the area of the induced depletion region and hence the depletion region capacitance.

4. The variable coupler of claim 1 wherein said substrate is of P-type conductivity and said region of one type conductivity is N-type.

5. The variable coupler of claim 1 wherein said thin film resistive means is of constant cross section along its length.

6. The variable coupler of claim 1 wherein said resistive means has a variable cross section along its length.

7. The variable coupler of claim 1 wherein the end of said thin film resistive means adjacent said other opening is grounded, and the polarity of said biasing potential at the other end of said resistive means is the same as the conductivity of said substrate.

8. The variable coupler of claim 1 in which a channel of conductivity opposite to that of the substrate extends between said regions with zero bias voltage applied across said resistive means.